(12) United States Patent
Chen et al.

(10) Patent No.: US 8,890,275 B2
(45) Date of Patent: Nov. 18, 2014

(54) OPTOELECTRONIC DEVICE AND METHOD OF FABRICATING THE SAME

(75) Inventors: Miin-Jang Chen, Taipei (TW); Hsin-Jui Chen, Taipei (TW); Wen-Ching Hsu, Hsinchu (TW)

(73) Assignee: Sino-American Silicon Products Inc., Hsinchu (TW)

( * ) Notice: Subject to any disclaimer, the term of this patent is extended or adjusted under 35 U.S.C. 154(b) by 150 days.

(21) Appl. No.: 13/305,066

(22) Filed: Nov. 28, 2011

(65) Prior Publication Data

US 2012/0199935 A1 Aug. 9, 2012

(30) Foreign Application Priority Data

Feb. 9, 2011 (TW) .............................. 100104200 A (51) Int. Cl.
*H01L 31/102* (2006.01)
*H01L 31/0216* (2014.01)
*H01L 31/18* (2006.01)

(52) U.S. Cl.
CPC .... *H01L 31/02161* (2013.01); *H01L 31/02167* (2013.01); *H01L 31/1868* (2013.01); *Y02E 10/50* (2013.01)
USPC ............................................ 257/461; 438/57

(58) Field of Classification Search
CPC ..................... H01L 31/1868; H01L 31/02167; H01L 31/02168; H01L 33/44; H01L 23/3171; H01L 23/3178
USPC ........ 257/461, E31.055, 79, 13, 14, 183, 184, 257/431, 12; 438/57
See application file for complete search history.

(56) References Cited

U.S. PATENT DOCUMENTS

| | | | |
|---|---|---|---|
| 2011/0100426 A1* | 5/2011 | Tsai ............................... | 136/246 |
| 2011/0186813 A1* | 8/2011 | Kim ................................ | 257/13 |
| 2011/0203632 A1* | 8/2011 | Sen et al. ....................... | 136/244 |
| 2012/0313063 A1* | 12/2012 | Wang et al. ...................... | 257/2 |

* cited by examiner

*Primary Examiner* — Whitney T Moore
(74) *Attorney, Agent, or Firm* — Osha Liang LLP (57) ABSTRACT

The invention discloses an optoelectronic device and method of fabricating the same. The optoelectronic device according to the invention includes a semiconductor structure combination, a first surface passivation layer formed on an upper surface of the semiconductor structure combination, and a second surface passivation layer formed on the first surface passivation layer. The semiconductor structure combination includes at least one P-N junction. In particular, the interfacial state density of the first surface passivation layer is lower than that of the second surface passivation layer, and the fixed oxide charge density of the second surface passivation layer is higher than that of the first surface passivation layer.

15 Claims, 5 Drawing Sheets

OPTOELECTRONIC DEVICE AND METHOD OF FABRICATING THE SAME

CROSS-REFERENCE TO RELATED APPLICATION

This utility application claims priority to Taiwan Application Serial Number 100104200, filed Feb. 9, 2011, which is incorporated herein by reference.

BACKGROUND OF THE INVENTION

1. Field of the Invention

The invention relates to an optoelectronic device and method of fabricating the same, e.g., a photo-detector, a solar cell and so on, and more in particular, to an optoelectronic device with high photoelectric conversion efficiency and method of fabricating the same.

2. Description of the Prior Art

Along with the rapid development of photoelectric industry, versatile optoelectronic devices such as light-emitting diodes, laser diodes, photo-detectors, solar cells, etc., have been extensively used in many fields of applications. Moreover, with the progress of relative technologies, user's requirement for performance such as luminescence efficiency or photoelectric conversion efficiency of the photoelectric device is higher and higher.

Generally speaking, formation of a passivation layer on the surface of an optoelectronic device can improve, to some extent, some properties of the optoelectronic device, such as luminescence efficiency or photoelectric conversion efficiency. Taking a silicon solar cell as an example, the silicon solar cell with high photoelectric conversion efficiency conventionally uses a thermal oxide layer as a surface passivation layer. To form the thermal oxide layer, the silicon wafer is exposed to an oxygen ambient at a high temperature such that the surface of the silicon wafer is oxidized to form the passivation layer of silicon dioxide. The passivation layer formed on the surface of the silicon solar cell can provide surface passivation effect so as to improve photoelectric conversion efficiency of the silicon solar cell.

However, the passivation layers formed by traditional techniques generally have some drawbacks such as poor control of film thickness, insufficient surface coverage, high defect density, and so on. Such poor-quality passivation layers cannot benefit a lot in improving the properties of optoelectronic devices.

In addition, the processing temperature at which the oxide layers are formed is often up to several hundred, or even over one thousand degrees Celsius. The high processing temperature could destroy the finished structures of the optoelectronic devices, or cause the malfunction or damage of equipments, so as to lower the reliability of process and the availability of equipments.

Accordingly, a scope of the invention is to provide an optoelectronic device and method of fabricating the same to solve aforesaid problems.

SUMMARY OF THE INVENTION

An optoelectronic device according to a preferred embodiment of the invention includes a semiconductor structure combination, a first surface passivation layer and a second surface passivation layer. The semiconductor structure combination includes at least one P-N junction, and has an upper surface. The first surface passivation layer is formed to overlay the upper surface of the semiconductor structure combination. The first surface passivation layer has a first interfacial state density ($D_{it1}$) and a first fixed oxide charge density ($Q_{f1}$). The second surface passivation layer is formed to overlay the first surface passivation layer. The second surface passivation layer has a second interfacial state density ($D_{it2}$) and a second fixed oxide charge density ($Q_{f2}$). In particular, the first interfacial state density ($D_{it1}$) is lower than the second interfacial state density ($D_{it2}$), and the second fixed oxide charge density ($Q_{f2}$) is higher than the first fixed oxide charge density ($Q_{f1}$).

In one embodiment, the semiconductor structure combination also includes an N-type region which provides the upper surface. Moreover, the first surface passivation layer provides low interfacial state density ($D_{it1}$), and the fixed oxide charge density ($Q_{f2}$) of the second surface passivation layer is positive.

In another embodiment, the semiconductor structure combination also includes a P-type region which provides the upper surface. Moreover, the first surface passivation layer provides low interfacial state density ($D_{it1}$), and the fixed oxide charge density ($Q_{f2}$) of the second surface passivation layer is negative.

In another embodiment, the semiconductor structure combination has a plurality of nanorods on the upper surface. Due to the excellent conformality of the thin films prepared by atomic layer deposition process, the first surface passivation surface layer is deposited to overlay the plurality of nanorods on the upper surface by use of a first atomic layer deposition process. Moreover, the second surface passivation layer is deposited to overlay the first surface passivation layer by use of a second atomic layer deposition process.

The optoelectronic device according to another preferred embodiment of the invention further includes a third surface passivation layer and a fourth surface passivation layer. The semiconductor also has a back surface. The third surface passivation layer is formed to overlay the back surface of the semiconductor structure combination. The fourth surface passivation layer is formed to overlay the third surface passivation layer. The third surface passivation layer has a third interfacial state density ($D_{it3}$) and a third fixed oxide charge density ($Q_{f3}$). The fourth surface passivation layer has a fourth interfacial state density ($D_{it4}$) and a fourth fixed oxide charge density ($Q_{f4}$). In particular, the third interfacial state density ($D_{it3}$) is lower than the fourth interfacial state density ($D_{it4}$), and the fourth fixed oxide charge density ($Q_{f4}$) is higher than the third fixed oxide charge density ($Q_{f3}$).

A method of fabricating an optoelectronic device, according to a preferred embodiment of the invention, firstly, is to form a semiconductor structure combination which includes at least one P-N junction and having an upper surface. Then, the method according to the invention is to form a first surface passivation layer to overlay the upper surface of the semiconductor structure combination, where the first surface passivation layer has a first interfacial state density ($D_{it1}$) and a first fixed oxide charge density ($Q_{f1}$). Finally, the method according to the invention is to form a second surface passivation layer to overlay the first surface passivation layer, where the second surface passivation layer has a second interfacial state density ($D_{it2}$) and a second fixed oxide charge density ($Q_{f2}$). In particular, the first interfacial state density ($D_{it1}$) is lower than the second interfacial state density ($D_{it2}$), and the second fixed oxide charge density ($Q_{f2}$) is higher than the first fixed oxide charge density ($Q_{f1}$).

In one embodiment, the first surface passivation layer, after formed on the upper surface of the semiconductor structure combination, is further annealed at an annealing temperature to reduce the first interfacial state density ($D_{it1}$) of the first surface passivation layer.

Compared to prior arts, the optoelectronic device and method of fabricating the same according to the invention can effectively enhance the properties and performance of optoelectronic devices.

The advantage and spirit of the invention may be understood by the following recitations together with the appended drawings.

DETAILED DESCRIPTION OF THE INVENTION

Some preferred embodiments of this present invention would be explained in the following paragraph, describing the characteristics, spirit, and advantages of the invention.

Figure 1:
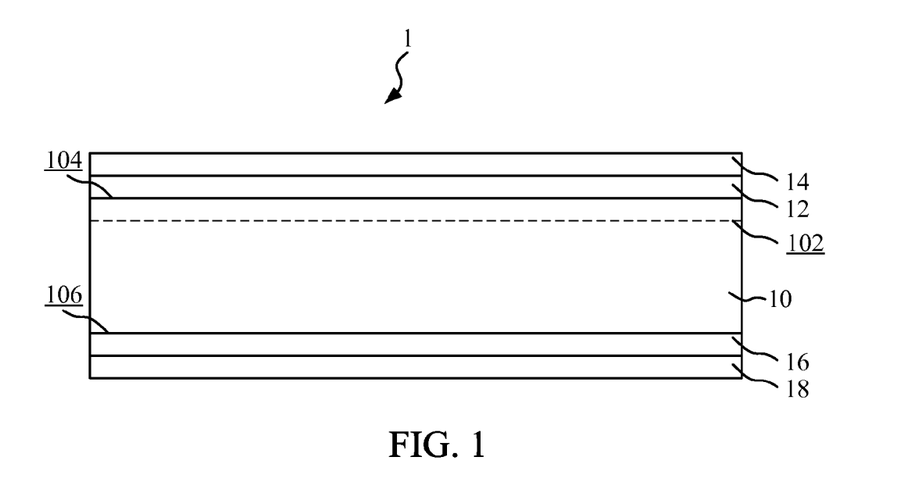
FIG. 1 illustratively shows an optoelectronic device according to a preferred embodiment of the invention.

Referring to FIG. 1, FIG. 1 is a cross-sectional view of an optoelectronic device 1 according to a preferred embodiment of the invention. In practical application, the optoelectronic device 1 according to the invention can be a solar cell, a photo-detector, etc.

As shown in FIG. 1, the optoelectronic device 1 according to the invention includes a semiconductor structure combination 10, a first surface passivation layer 12 and a second surface passivation layer 14. The semiconductor structure combination 10 includes at least one P-N junction 102, and has an upper surface 104. In the case shown in FIG. 1, it only illustratively shows a P-N junction 102 as an example for explanation.

In general, the charges distributed in the surface passivation layer can be divided into: (1) interface trapped charge, characterized by interfacial state density ($D_{it}$); (2) fixed oxide charge; (3) oxide trapped charge; and (4) mobile charge. Among these charges, the interfacial state density ($D_{it}$) and fixed oxide charge density ($Q_f$) are the primary charges distributed in the surface passivation layer. It is noted that the interfacial state density ($D_{it}$) of the surface passivation layer must be measured and characterized under the condition that the surface passivation layer is deposited on the top-most layer of the semiconductor structure combination such as a silicon layer.

The first surface passivation layer 12 is formed to overlay the upper surface 104 of the semiconductor structure combination 10. The first surface passivation layer 12 has a first interfacial state density ($D_{it1}$) and a first fixed oxide charge density ($Q_{f1}$). The second surface passivation layer 14 is formed to overlay the first surface passivation layer 12. The second surface passivation layer 14 has a second interfacial state density ($D_{it2}$) and a second fixed oxide charge density ($Q_{f2}$). It is noted that the second interfacial state density ($D_{it2}$) characterizes the interfacial quality of the second passivation layer 14 if deposited on the semiconductor structure combination 10.

In particular, the first interfacial state density ($D_{it1}$) is lower than the second interfacial state density ($D_{it2}$), and the second fixed oxide charge density ($Q_{f2}$) is higher than the first fixed oxide charge density ($Q_{f1}$).

In practical application, the optoelectronic device 1 according to the invention is taken a solar cell as an example, and in general the upper surface 104 of the semiconductor structure combination 10 is treated by a surface texturing to lower the reflectivity of incident sunlight.

To form high-quality surface passivation layer on the textured upper surface 104 of the semiconductor structure combination 10, in one embodiment, the invention utilizes an atomic layer deposition (ALD) process to form the first surface passivation layer 12 and the second surface passivation layer 14. During film deposition by ALD process, two kinds of precursors are alternately introduced into a reaction chamber. In an atomic layer deposition cycle (ALD cycle), one kind of precursors is chemically adsorbed on whole of the surface of the substrate, and only one monolayer of the precursor molecules is adsorbed on the surface of the substrate. The precursors not adsorbed on the surface of the substrate are carried out by a carrier gas. Then, the other kind of precursors is introduced into the reaction chamber, and reacts with the precursor molecules previously adsorbed on the surface of the substrate. That is to say, one ALD cycle leads to the deposition of a film with single atomic layer on whole of the substrate surface. This characteristic of ALD process is called self-limiting capable of controlling the film thickness with a precision of single atomic layer (~1 Å). In conclusion, the atomic layer deposition process adopted by the invention has the following advantages: (1) Facile thickness control in one monolayer accuracy; (2) Accurate composition control; (3) Facile doping to achieve high doping concentrations; (4) Stoichiometric films with low defect densities; (5) Low deposition temperatures; (6) High conformality and good step coverage; (7) High uniformity over a large area; (8) Large-area and large-batch capacity; and (9) Good reproducibility.

Furthermore, in practical application, the atomic layer deposition based process adopted by the invention can be an atomic layer deposition process, a plasma-enhanced atomic layer deposition (PE-ALD) process, a plasma-assisted atomic layer deposition process, or combination thereof, such as combination of the atomic layer deposition process and the plasma-enhanced atomic layer deposition process or combination of the atomic layer deposition process and the plasma-assisted atomic layer deposition process. It is noted that the atomic layer deposition process is also named as Atomic Layer Epitaxy (ALE) process or Atomic Layer Chemical Vapor Deposition (ALCVD) process, so that these processes are actually identical. During deposition of an oxide film by the plasma-enhanced ALD process or the plasma-assisted ALD process, oxygen molecules are ionized to form oxygen ions as the oxidants, so as to lower the processing temperature and to improve the film quality. In addition to the advantages mentioned above, as compared with the typical thermal-mode atomic layer deposition process, the plasma-enhanced atomic layer deposition process (or plasma-assisted atomic layer deposition process) provides the following advantages: (1) Wider choice of precursors and materials; (2) Improvement in film quality due to higher film density and lower impurity level; (3) Lower deposition temperatures; and (4) Ability to control film stoichiometry. Furthermore, during the deposition of nitride films, the plasma-enhanced deposition process can use plasma to dissociate $N_2$, $NH_3$ or $N_2O$ gases to form nitrogen ions which involve in the reactions to form nitride films.

Referring to Table 1, Table 1 lists the interfacial state density ($D_{it}$) and fixed oxide charges density ($Q_f$) of $Al_2O_3$, $HfO_2$, $ZrO_2$ films deposited by a thermal-mode atomic layer deposition process, and those of $Al_2O_3$ film deposited by a plasma-mode atomic layer deposition process, where q is the electron charge equal to $1.60 \times 10^{-19}$ Coulombs. The data listed in Table 1 also include the data of the films as deposited and data of the films treated by the post-deposition annealing in a forming gas atmosphere.

TABLE 1

|  | thermal-mode $Al_2O_3$ | plasma-mode $Al_2O_3$ | thermal-mode $HfO_2$ | thermal-mode $ZrO_2$ |
|---|---|---|---|---|
| $Q_f(q \cdot cm^{-2})$ | | | | |
| as-deposited | $1.08 \times 10^{12}$ | $-4.56 \times 10^{12}$ | $4.5 \times 10^{12}$ | $4.0 \times 10^{12}$ |
| after annealing | $6.98 \times 10^{11}$ | $-4.23 \times 10^{12}$ | $3.8 \times 10^{12}$ | $2.3 \times 10^{12}$ |
| $D_{it}(eV^{-1} \cdot cm^{-2})$ | | | | |
| as-deposited | $4 \times 10^{12}$ | very high | $2.5 \times 10^{12}$ | $4 \times 10^{12}$ |
| after annealing | $8 \times 10^{11}$ | $7.3 \times 10^{12}$ | $1.5 \times 10^{12}$ | $1 \times 10^{12}$ |

Among the fixed oxide charges density ($Q_f$) as shown in Table 1, the fixed oxide charge densities in the thermal-mode $Al_2O_3$ films, the thermal-mode $HfO_2$ films and the thermal-mode $ZrO_2$ films all are positive, and $Q_f$ in thermal-mode $HfO_2$ films>$Q_f$ in thermal-mode $ZrO_2$ films>$Q_f$ in thermal-mode $Al_2O_3$ films. It may be noted that the fixed oxide charges density ($Q_f$) in the plasma-mode $Al_2O_3$ films are negative. Even after the forming-gas annealing, the fixed oxide charges density ($Q_f$) in the plasma-mode $Al_2O_3$ film cannot be effectively suppressed.

Also as shown in Table 1, with comparison among the interfacial state density ($D_{it}$), the thermal-mode $Al_2O_3$ film after the forming-gas annealing has the minimum interfacial state density ($D_{it}$), but the interfacial state density ($D_{it}$) of the as deposited $Al_2O_3$ film prepared by plasma-mode atomic layer deposition is very high. As for the thermal-mode $HfO_2$ film and the thermal-mode $ZrO_2$ film, the interfacial state densities ($D_{it}$) of these two films after the forming-gas annealing are close to and slightly greater than that of the $Al_2O_3$ film after the forming-gas annealing.

Furthermore, Table 1 also shows that after the forming-gas annealing, the interfacial state densities ($D_{it}$) and the fixed oxide charge densities ($Q_f$) of these films are suppressed. Therefore, it is evident that performing forming-gas annealing can improve the film and interfacial quality of surface passivation layer.

In one embodiment, the first surface passivation layer 12 can be a film of $Al_2O_3$, $ZrO_2$, $HfO_2$, $SiO_2$, $La_2O_3$, etc., but not limit to the above. Moreover, the second surface passivation layer 14 can be a film of $Al_2O_3$, $ZrO_2$, $HfO_2$, $SiO_2$, $La_2O_3$, $TiO_2$, MN, SiN, Al-doped ZnO (ZnO:Al), etc., but not limit to the above.

In one embodiment, the semiconductor structure combination 10 also includes an N-type region which provides the upper surface 104. Moreover, the first surface passivation layer 12 provides low interfacial state density ($D_{it1}$), and the fixed oxide charge density ($Q_{f2}$) of the second surface passivation layer 14 is positive.

In another embodiment, the semiconductor structure combination 10 also includes a P-type region which provides the upper surface 104. Moreover, the first surface passivation layer 12 provides low interfacial state density ($D_{it1}$), and the fixed oxide charge density ($Q_{f2}$) of the second surface passivation layer 14 is negative.

Figure 2:
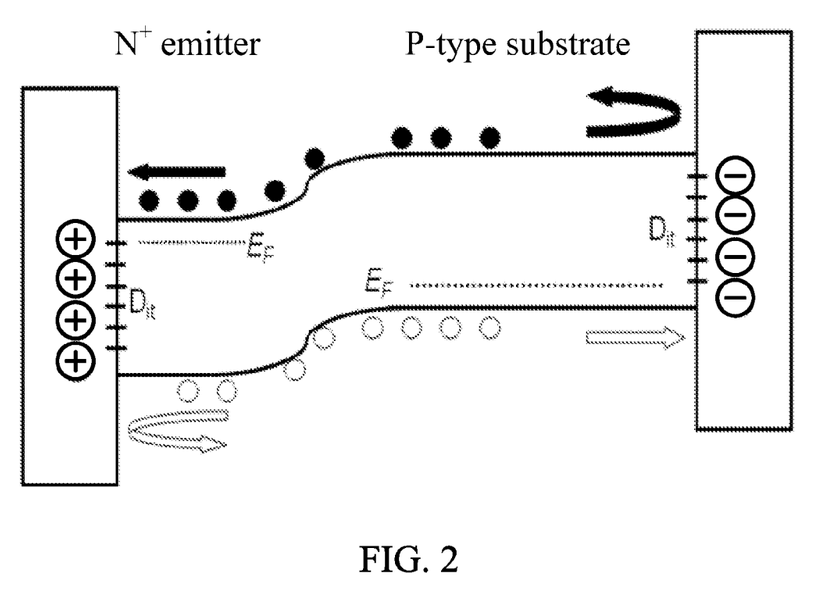
FIG. 2 illustratively shows the effect of positive and negative charges in a surface passivation layer on a P-type region and an N-type region in an optoelectronic device.

Taking a silicon solar cell as an example, the charges in the surface passivation layer have significant influence on the performance of the solar cell, and this effect is the so-called field-effect surface passivation. FIG. 2 illustratively shows the effect of positive and negative charges in a surface passivation layer on a silicon solar cell with a P-type substrate and an $N^+$ (heavily-doped N type) emitter. As shown in FIG. 2, if the charges in the surface passivation layer are positive (as the left of FIG. 2), positive charges would repel the minority carriers—holes in the $N^+$ emitter to reduce the probability of carrier recombination occurring at the left interface and to increase the minority carrier lifetime. If the charges in the surface passivation layer are negative (as the right of FIG. 2), negative charges would repel the minority carriers—electrons in the P-type substrate to reduce the probability of carrier recombination occurring at the right interface and increase the minority carrier lifetime. Therefore, if the charges in the surface passivation layer on the $N^+$ emitter are positive, or if the charges in the surface passivation layer on back of the P-type substrate are negative, the efficiency of the silicon solar cell can be improved. Therefore, regarding the selection of materials for the surface passivation layers, a surface passivation layer carrying positive charges on the $N^+$ emitter and a surface passivation layer carrying negative charges on bask of the P-type substrate are preferred to improve the efficiency of a solar cell.

In one embodiment, the semiconductor structure combination 10 includes a plurality of nanorods on the upper surface 104, and thereby, the reflectivity of incident sunlight can be further lowered. However, as compared with the upper surface of the semiconductor structure combination which is conventionally a textured surface, the upper surface 104 of the semiconductor structure combination 10 with the plurality of nanorods has great aspect ratio (the ratio of the length over the diameter of the nanorods). Therefore, since the films prepared by atomic layer deposition have excellent step coverage and conformality, it is appropriate to prepare the first surface passivation layer 12 and the second surface passivation layer 14 using an atomic layer deposition process. Therefore, the first surface passivation layer 12 is deposited to overlay the plurality of nanorods on the upper surface 104 by use of a first atomic layer deposition process. Moreover, the second surface passivation layer 14 is deposited to overlay the first surface passivation layer 12 by use of a second atomic layer deposition process. The deposition temperatures of the first atomic layer deposition process and the second atomic layer deposition process have to be set not to destroy the structures of the optoelectronic device.

Referring to FIG. 1 again, the optoelectronic device 1 according to another preferred embodiment of the invention is schematically illustrated in FIG. 1 in a cross-sectional view. The semiconductor structure combination 10 has a back surface 106.

As shown in FIG. 1, the optoelectronic device 1 further includes a third surface passivation layer 16 and a fourth surface passivation layer 18. The third surface passivation layer 16 is formed to overlay the back surface 106 of the semiconductor structure combination 10. The third surface passivation layer 16 has a third interfacial state density ($D_{it3}$) and a third fixed oxide charge density ($Q_{f3}$). The fourth surface passivation layer 18 is formed to overlay the third surface passivation layer 16. The fourth surface passivation layer 18 has a fourth interfacial state density ($D_{it4}$) and a fourth fixed oxide charge density ($Q_{f4}$). It is noted that the fourth interfacial state density ($D_{it4}$) characterizes the interface quality of the fourth passivation layer 18 if deposited on the semiconductor structure combination 10.

In particular, the third interfacial state density ($D_{it3}$) is lower than the fourth interfacial state density ($D_{it4}$), and the fourth fixed oxide charge density ($Q_{f4}$) is higher than the third fixed oxide charge density ($Q_{f3}$).

In one embodiment, the semiconductor structure combination 10 also includes a P-type region which provides the back surface 106. Moreover, the third surface passivation layer 16 provides low interfacial state density ($D_{it3}$), and the fixed oxide charge density ($Q_{f4}$) of the fourth surface passivation layer 18 is negative.

In another embodiment, the semiconductor structure combination 10 also includes an N-type region which provides the back surface 106. Moreover, the third surface passivation layer 16 provides low interfacial state density ($D_{it3}$), and the fixed oxide charge density ($Q_{f4}$) of the fourth surface passivation layer 18 is positive.

Figure 3A:
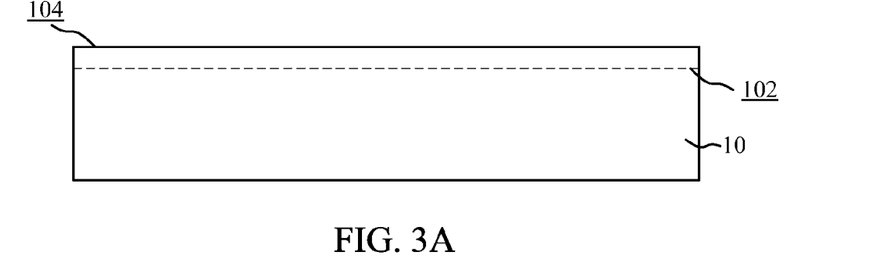
FIGS. 3A through 3C illustratively show a method according to a preferred embodiment of the invention to fabricate an optoelectronic device as shown in FIG. 1.
Figure 3B:
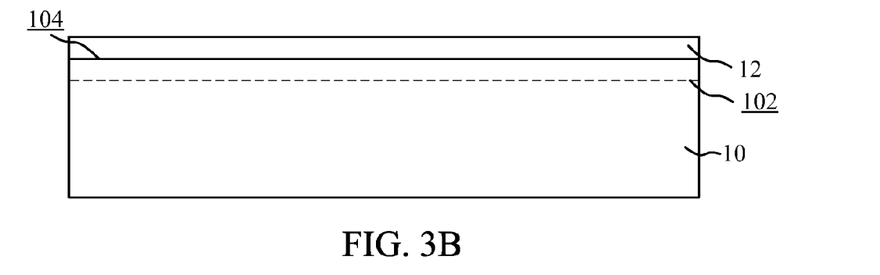
Figure 3C:
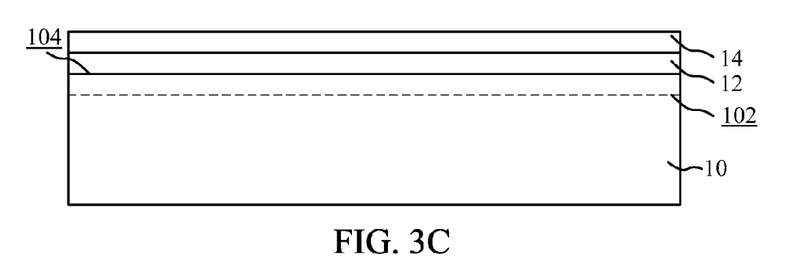

Referring to FIGS. 3A through 3C, these figures illustratively show sectional views of a method of fabricating an optoelectronic device 1 as shown in FIG. 1 in accordance with a preferred embodiment of the invention.

As shown in FIG. 3A, firstly, the method of fabricating the optoelectronic device 1 in accordance with the preferred embodiment of the invention, firstly, is to form a semiconductor structure combination 10. The semiconductor structure combination 10 includes at least one P-N junction 102, and has an upper surface 104.

Then, as shown in FIG. 3B, the method according to the invention is to form a first surface passivation layer 12 to overlay the upper surface 104 of the semiconductor structure combination 104, where the first surface passivation layer 12 has a first interfacial state density ($D_{it1}$) and a first fixed oxide charge density ($Q_{f1}$).

Finally, as shown in FIG. 3C, the method according to the invention is to form a second surface passivation layer 14 to overlay the first surface passivation layer 12, where the second surface passivation layer 14 has a second interfacial state density ($D_{it2}$) and a second fixed oxide charge density ($Q_{f2}$). It is noted that the second interfacial state density ($D_{it2}$) characterizes the interfacial quality of the second passivation layer 14 if deposited on the semiconductor structure combination 10. In particular, the first interfacial state density ($D_{it1}$) is lower than the second interfacial state density ($D_{it2}$), and the second fixed oxide charge density ($Q_{f2}$) is higher than the first fixed oxide charge density ($Q_{f1}$).

In one embodiment, the first surface passivation layer 12, after formed on the upper surface 104 of the semiconductor structure combination 10, is further annealed at an annealing temperature to reduce the first interfacial state density ($D_{it1}$) of the first surface passivation layer 12.

In one embodiment, the semiconductor structure combination 10 also includes an N-type region which provides the upper surface 104. Moreover, the first surface passivation layer 12 provides low interfacial state density ($D_{it1}$), and the fixed oxide charge density ($Q_{f2}$) of the second surface passivation layer 14 is positive.

In another embodiment, the semiconductor structure combination 10 also includes a P-type region which provides the upper surface 104. Moreover, the first surface passivation layer 12 provides low interfacial state density ($D_{it1}$), and the fixed oxide charge density ($Q_{f2}$) of the second surface passivation layer 14 is negative.

In one embodiment, the semiconductor structure combination 10 includes a plurality of nanorods on the upper surface 104, and thereby, the reflectivity of incident sunlight can be further lowered. Due to the excellent conformality and step coverage of atomic layer deposition process, the first surface passivation layer 12 is deposited to overlay the plurality of nanorods on the upper surface 104 by use of a first atomic layer deposition process. Moreover, the second surface passivation layer 14 is deposited to overlay the first surface passivation layer 12 by use of a second atomic layer deposition process.

In one embodiment, the first surface passivation layer 12 can be a film of $Al_2O_3$, $ZrO_2$, $HfO_2$, $SiO_2$, $La_2O_3$, etc., but not limit to the above. Moreover, the second surface passivation layer 14 can be a film of $Al_2O_3$, $ZrO_2$, $HfO_2$, $SiO_2$, $La_2O_3$, $TiO_2$, MN, SiN, Al-doped ZnO (ZnO:Al), etc., but not limit to the above.

Taking a silicon solar cell as an example, the method according to the invention, firstly, is to perform a surface texturing treatment or to form a plurality of nanorods on an upper surface of a silicon wafer. Next, the method according to the invention is to coat a layer of aluminum as a back electrode on a back of the silicon wafer opposite to the upper surface by a screen print or a thermal evaporation. Then, the method according to the invention is to perform an annealing process on the resulting structure to form a back surface field. Afterward, the method according to the invention is to form a front electrode on the upper surface of the silicon wafer by a screen print. Subsequently, the method according to the invention is to form a first surface passivation layer overlaying the upper surface of the silicon wafer by an atomic layer deposition process. Then, the method according to the invention is to perform an annealing process on the first surface passivation layer at an annealing temperature. Finally, the method according to the invention is to form a second surface passivation layer overlaying the first surface passivation layer by another atomic layer deposition process.

Figure 3D:
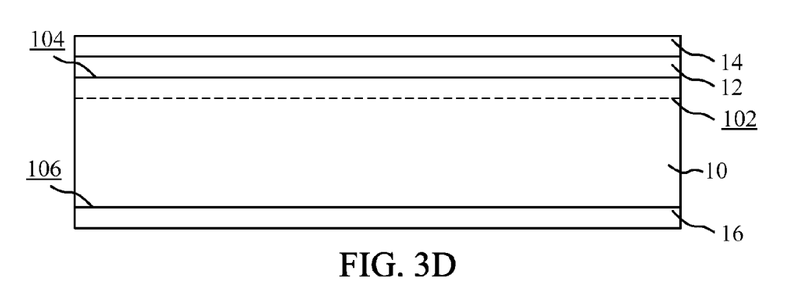
FIGS. 3D through 3E illustratively show a method according to another preferred embodiment of the invention to fabricate an optoelectronic device as shown in FIG. 1.
Figure 3E:
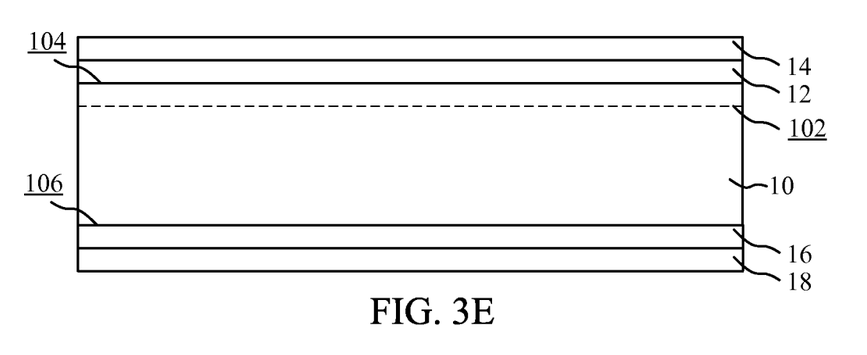

Referring to FIG. 3D through FIG. 3E, these figures illustratively show sectional views of a method of fabricating an optoelectronic device 1 as shown in FIG. 1 in accordance with another preferred embodiment of the invention.

As shown in FIG. 3D, the method of fabricating the optoelectronic device 1, according to another preferred embodiment of the invention, is further to form a third surface passivation layer 16 overlaying the back surface 106 of the semiconductor structure combination 10, where the third surface passivation layer 16 has a third interfacial state density ($D_{it3}$) and a third fixed oxide charge density ($Q_{f3}$).

Finally, as shown in FIG. 3E, the method of fabricating the optoelectronic device 1, is to form a fourth surface passivation layer 18 overlaying the third surface passivation layer 16, where the fourth surface passivation layer 18 has a fourth interfacial state density ($D_{it4}$) and a fourth fixed oxide charge density ($Q_{f4}$). It is noted that the fourth interfacial state density ($D_{it4}$) characterizes the interfacial quality of the fourth passivation layer 18 if deposited on the semiconductor structure combination 10. In particular, the third interfacial state density ($D_{it3}$) is lower than the fourth interfacial state density ($D_{it4}$), and the fourth fixed oxide charge density ($Q_{f4}$) is higher than the third fixed oxide charge density ($Q_{f3}$).

In one embodiment, the semiconductor structure combination 10 also includes a P-type region which provides the back surface 106. Particularly, the third surface passivation layer 16 provides low interfacial state density ($D_{it3}$), and the fixed oxide charge density ($Q_{f4}$) of the fourth surface passivation layer 18 is negative.

In another embodiment, the semiconductor structure combination 10 also includes an N-type region which provides the upper surface 106. Particularly, the third surface passivation layer 16 provides low interfacial state density ($D_{it3}$), and the fixed oxide charge density ($Q_{f4}$) of the fourth surface passivation layer 18 is positive.

In summary, compared to prior arts, the optoelectronic device and method of fabricating the same according to the invention can effectively enhance the properties and performance of optoelectronic devices.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. An optoelectronic device, comprising:
   a semiconductor structure combination, comprising at least one P-N junction and having an upper surface, wherein the semiconductor structure combination has a plurality of nanorods on the upper surface;
   a first surface passivation layer, being formed to overlay the upper surface of the semiconductor structure combination, and having a first interfacial state density and a first fixed oxide charge density; and
   a second surface passivation layer, being formed to directly overlay and come into contact with the first surface passivation layer, and having a second interfacial state density and a second fixed oxide charge density;
   wherein the first interfacial state density is lower than the second interfacial state density, and the second fixed oxide charge density is higher than the first fixed oxide charge density.

2. The optoelectronic device of claim 1, wherein the semiconductor structure combination also comprises an N-type region providing the upper surface, and the second surface passivation layer has positive charges.

3. The optoelectronic device of claim 1, wherein the semiconductor structure combination also comprises a P-type region providing the upper surface, and the second surface passivation layer has negative charges.

4. The optoelectronic device of claim 1, wherein the first surface passivation surface layer is deposited to overlay the plurality of nanorods on the upper surface by a first atomic layer deposition process, and the second surface passivation layer is deposited to overlay the first surface passivation layer by a second atomic layer deposition process.

5. The optoelectronic device of claim 1, the semiconductor structure combination also having a back surface, said optoelectronic device further comprising:
   a third surface passivation layer, being formed to overlay the back surface of the semiconductor structure combination, and having a third interfacial state density and a third fixed oxide charge density; and
   a fourth surface passivation layer, being formed to overlay the third surface passivation layer, and having a fourth interfacial state density and a fourth fixed oxide charge density;
   wherein the third interfacial state density is lower than the fourth interfacial state density, and the fourth fixed oxide charge density is higher than the third fixed oxide charge density.

6. The optoelectronic device of claim 4, the semiconductor structure combination also having a P-type region providing a back surface, and a fourth surface passivation layer having negative charges.

7. The optoelectronic device of claim 4, the semiconductor structure combination also having an N-type region providing a back surface, and a fourth surface passivation layer having positive charges.

8. A method of fabricating an optoelectronic device, comprising:
   forming a semiconductor structure combination comprising at least one P-N junction and having an upper surface, wherein the semiconductor structure combination has a plurality of nanorods on the upper surface;
   forming a first surface passivation layer to overlay the upper surface and the plurality of nanorods of the semiconductor structure combination, wherein the first surface passivation layer has a first interfacial state density and a first fixed oxide charge density; and
   forming a second surface passivation layer to directly overlay and come into contact with the first surface passivation layer, wherein the second surface passivation layer has a second interfacial state density and a second fixed oxide charge density;
   wherein the first interfacial state density is lower than the second interfacial state density, and the second fixed oxide charge density is higher than the first fixed oxide charge density.

9. The method of claim 8, wherein the first surface passivation layer, after formed on the upper surface of the semiconductor structure combination, is further annealed at an annealing temperature to reduce the first interfacial state density of the first surface passivation layer.

10. The method of claim 8, wherein the semiconductor structure combination also comprises an N-type region providing the upper surface, and the second surface passivation layer has positive charges.

11. The method of claim 8, wherein the semiconductor structure combination also comprises a P-type region providing the upper surface, and the second surface passivation layer has negative charges.

12. The method of claim 8, wherein the first surface passivation surface layer is deposited to overlay the plurality of nanorods on the upper surface by a first atomic layer deposition process, and the second surface passivation layer is deposited to overlay the first surface passivation layer by a second atomic layer deposition process.

13. The method of claim 8, the semiconductor structure combination also having a back surface, said method further comprising the steps of: forming a third surface passivation layer to overlay the back surface of the semiconductor structure combination, wherein the third surface passivation layer has a third interfacial state density and a third fixed oxide charge density; and forming a fourth surface passivation layer to overlay the third surface passivation layer, wherein the fourth surface passivation layer has a fourth interfacial state density and a fourth fixed oxide charge density; wherein the third interfacial state density is lower than the fourth interfacial state density, and the fourth fixed oxide charge density is higher than the third fixed oxide charge density.

14. The method of claim 13, the semiconductor structure combination also having a P-type region providing the back surface, and the fourth surface passivation layer has negative charges.

15. The method of claim 13, the semiconductor structure combination also having an N-type region providing the back surface, and the fourth surface passivation layer has positive charges.

* * * * *